United States Patent
Janka et al.

(10) Patent No.: US 11,880,192 B2
(45) Date of Patent: Jan. 23, 2024

(54) METHOD FOR ANALYZING EFFECTS OF OPERATOR ACTIONS IN INDUSTRIAL PLANTS

(71) Applicant: ABB Schweiz AG, Baden (CH)

(72) Inventors: Dennis Janka, Heidelberg (DE); Moncef Chioua, Heidelberg (DE); Pablo Rodriguez, Ilvesheim (DE); Mario Hoernicke, Landau (DE); Benedikt Schmidt, Heidelberg (DE); Benjamin Kloepper, Mannheim (DE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/228,730

(22) Filed: Apr. 13, 2021

(65) Prior Publication Data

US 2021/0318671 A1   Oct. 14, 2021

(30) Foreign Application Priority Data

Apr. 14, 2020 (EP) ..................................... 20169422
Feb. 11, 2021 (EP) ..................................... 21156642

(51) Int. Cl.
*G05B 19/418* (2006.01)
*G06F 30/18* (2020.01)
(Continued)

(52) U.S. Cl.
CPC ... *G05B 19/41865* (2013.01); *G05B 19/4183* (2013.01); *G05B 19/4185* (2013.01);
(Continued)

(58) Field of Classification Search
CPC .......... G05B 19/41865; G05B 19/4183; G05B 19/4185; G05B 19/41885; G06F 30/18;
(Continued)

(56) References Cited

U.S. PATENT DOCUMENTS

| 11,212,322 B2 * | 12/2021 | Nicoll ..................... H04L 63/20 |
| 2005/0086238 A1 * | 4/2005 | Nevin, III ........... G06F 16/2425 |

(Continued)

OTHER PUBLICATIONS

Iyun Oe, "Plant-Wide Diagnosis: Cause-and-Effect Analysis Using Process Connectivity and Directionality Information," PhD Thesis, Feb. 2012, pp. 1-254, Imperial College London, London, United Kingdom.
(Continued)

*Primary Examiner* — Tonia L Dollinger
*Assistant Examiner* — Joseph M Cousins
(74) *Attorney, Agent, or Firm* — Leydig, Voit & Mayer, Ltd.

(57) ABSTRACT

A method for determining an interdependency between a plurality of elements in an industrial processing system includes: providing a process flow diagram (PFD) of a topology of the processing system; transforming the PFD into a directed graph, each element of the plurality of elements being transformed into a node and each relation between the plurality of elements being transformed into a directed edge; selecting one node of the plurality of nodes as a starting node; and constructing a subgraph, the subgraph including all the nodes that are forward-connected from the starting node so as to show at least one interdependency between the plurality of elements in the subgraph.

7 Claims, 3 Drawing Sheets

(51) Int. Cl.
  *H04L 41/12* (2022.01)
  *H04L 41/14* (2022.01)
(52) U.S. Cl.
  CPC ....... *G05B 19/41885* (2013.01); *G06F 30/18* (2020.01); *H04L 41/12* (2013.01); *H04L 41/145* (2013.01)
(58) Field of Classification Search
  CPC ........ G06F 30/00; G06F 17/10; G06F 16/116; G06F 16/9024; H04L 41/12; H04L 41/145
  See application file for complete search history.

(56) References Cited

U.S. PATENT DOCUMENTS

| | | | |
|---|---|---|---|
| 2018/0121506 A1* | 5/2018 | Barbosa Fagnani Gomes Lotz | G06F 16/9024 |
| 2018/0224831 A1* | 8/2018 | Liu | G05B 23/0232 |
| 2018/0300048 A1* | 10/2018 | Law | G05B 19/0426 |
| 2019/0080164 A1* | 3/2019 | Duke | G06V 10/82 |
| 2019/0349255 A1* | 11/2019 | Jiang | H04L 41/0895 |
| 2020/0036595 A1* | 1/2020 | Wallerstein | G06F 9/505 |
| 2022/0100183 A1* | 3/2022 | Dufrene | H04L 41/12 |
| 2022/0393938 A1* | 12/2022 | Mishra | H04L 43/0811 |

OTHER PUBLICATIONS

Jegatheeswaran Thambirajah et al., "Cause-and-effect analysis in chemical processes utilizing XML, plant connectivity and quantitative process history," Computers & Chemical Engineering, Feb. 23, 2009, pp. 503-512, vol. 33, Issue 2, Elsevier, United Kingdom.
Bauer, Margaret et al., "A practical method for identifying the propagation path of plant-wide disturbances," Journal of Process Control, Aug. 2008, pp. 701-719, Elsevier, United Kingdom.
S.Y.Yim et al., "Using process topology in plant-wide control loop performance assessment," Computers & Chemical Engineering, Dec. 2006, pp. 86-99, vol. 31. Issue 2, Elsevier, United Kingdom.

* cited by examiner

METHOD FOR ANALYZING EFFECTS OF OPERATOR ACTIONS IN INDUSTRIAL PLANTS

CROSS-REFERENCE TO PRIOR APPLICATION

Priority is claimed to European Patent Application No. EP 20 169 422.1, filed on Apr. 14, 2020, and to European Patent Application No. EP 21 156 642.7, filed on Feb. 11, 2021. The entire disclosure of both applications is hereby incorporated by reference herein.

FIELD

The invention relates to the field of processing systems, particularly for industrial plants. The invention further relates to a computer program product, a computer-readable storage medium, and to a use of the method.

BACKGROUND

In many cases, industrial plants are or comprise complex networks of elements connected by flow of material, energy and information. These connections make the elements interdependent, and a change at one element, e.g. of its values, may impact one or more of the other elements, possibly even distant elements. Thus, predicting effects, including so-called "side effects", of value-changes and/or other "actions" may become difficult for plant operators, particularly for actions that are not often taken. Furthermore, it may be difficult to identify whether an untypical process value has a relevant impact on the production process or, not.

SUMMARY

In an embodiment, the present invention provides a method for determining an interdependency between a plurality of elements in an industrial processing system, the method comprising: providing a process flow diagram (PFD) of a topology of the processing system; transforming the PFD into a directed graph, each element of the plurality of elements being transformed into a node and each relation between the plurality of elements being transformed into a directed edge; selecting one node of the plurality of nodes as a starting node; and constructing a subgraph, the subgraph comprising all the nodes that are forward-connected from the starting node so as to show at least one interdependency between the plurality of elements in the subgraph.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
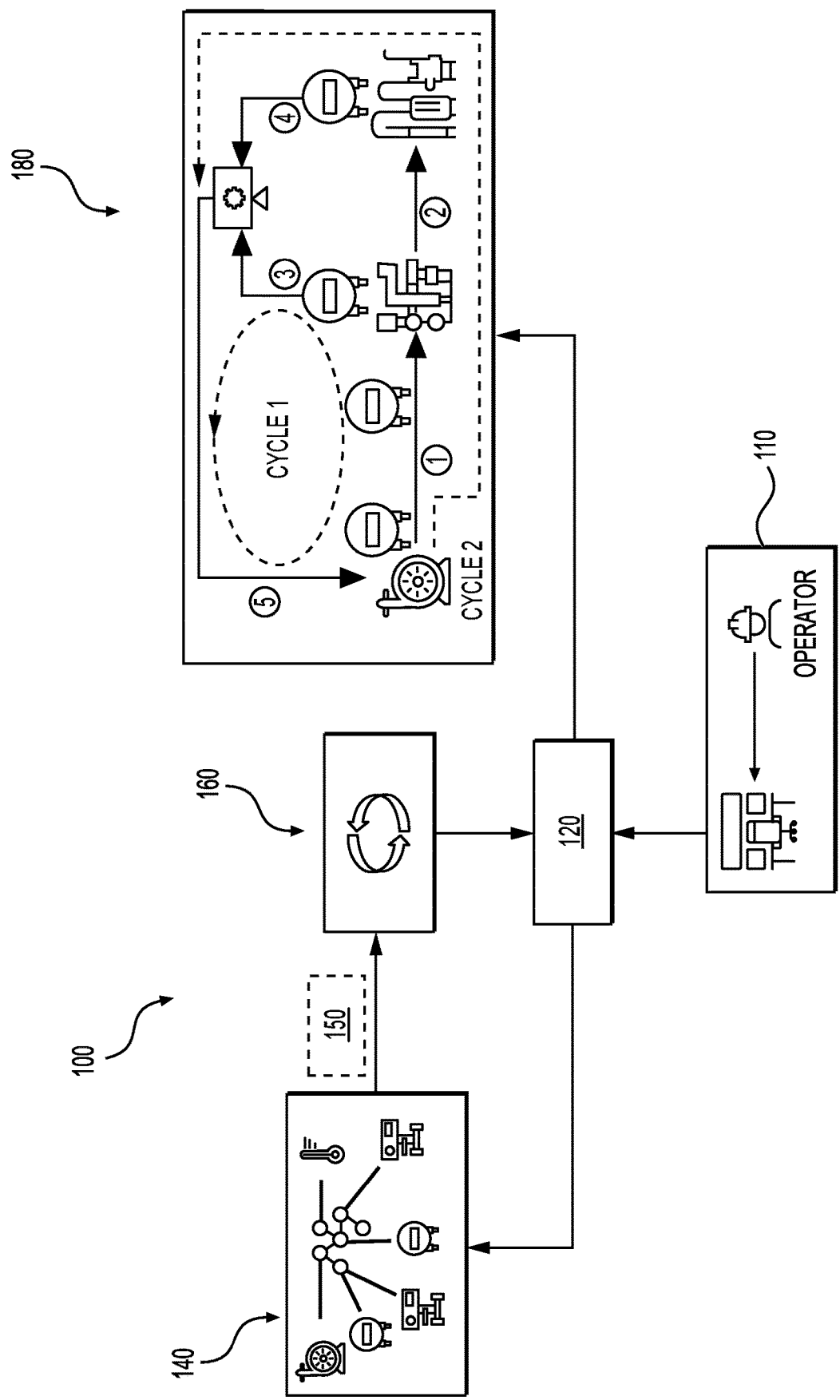
FIG. 1 schematically shows an example of analysing effects of an operator action according to an embodiment.

In an embodiment, the present invention provides a method for determining interdependencies between elements in a processing system, particularly in an industrial processing system.

One aspect relates to a method for determining an interdependency between a plurality of elements in an industrial processing system. The method comprises the steps of:

providing a process flow diagram, PFD, of a topology of the processing system;

transforming the PFD into a directed graph, wherein each element of the plurality of elements is transformed into a node and each relation between the plurality of elements is transformed into a directed edge;

selecting one node of the plurality of nodes as a starting node; and constructing a subgraph, wherein the subgraph consists of all the nodes that are forward-connected from the starting node, thus showing at least one interdependency between the plurality of elements in the subgraph.

The processing system may be an industrial plant, as used, e.g., in chemical and process engineering. The processing system may be configured for producing and/or for manufacturing substances, for instance materials and/or compounds. Examples for elements may comprise pumps, compressors, vessels or pressure vessels, tanks, heat exchangers, furnaces, fans, cooling towers, valves, etc. The process flow diagram may be a piping and instrumentation diagram (P&ID) and/or another kind of diagram that depicts elements of a processing system.

The transforming the PFD into a directed graph may be done, for instance, by an adjacency matrix, which represents the plurality of elements as rows and columns, and the relations between the plurality of elements as matrix-entries, thus representing directed edges between the elements. Other representations of a directed graph may be used as well. Once the directed graph is available, an arbitrary node of the plurality of nodes may be selected as the starting node. In some cases, it may be useful to take an input-element, which can be triggered or otherwise changed by an operator, as the starting node. This "input-element", in the meaning of a node in the graph, may be to start or stop a motor, or may comprise to change a process-variable. This may be done for one or for a plurality of selected starting nodes, for example for process-variables that are known as highly relevant, or even for "untypical" process-variables, whose effect may be not be completely known. Then, the subgraph that forward-connects the nodes can be constructed. Thus, at least one interdependency is shown—i.e. can be observed—between the plurality of elements in the subgraph. This part of the topology model represents a subgraph with all elements that can be affected.

This method advantageously provides operators with insight on effects, even on so-called "side effects" of an operator action and/or of a process-variable. A "side effect" may be a reaction of an element that has not been planned and/or foreseen by the operator. Side effects may comprise positive, negative, or neglectable effects. Hence, operator actions and/or other changes may be subject to be studied in depth. At least in some case, this may lead to a better understanding of actions, and/or in some cases to provide safer process guidance by preventing operators to cause undesired side effects.

In various embodiments, the method comprises the further step of: Outputting, for the subgraph, all nodes and all relations of the subgraph. The outputting may comprise to generate a list of all nodes, representing equipment and assets possibly affected by an operator action, i.e. related to a starting node or a change of its values. The outputting may comprise to provide an approximate or "linguistic" quantification of effects (including side effects) of an operator action. The outputting may comprise a visualization of the cause and effect relationship inside the process plant to the engineer for validation, e.g. as dynamically created process graphic or as cause-and-effect matrix.

In various embodiments, the method comprises the further step of: Searching, in the subgraph, for a cyclic interdependency. One idea may be to perform a search in the subgraph following the direction of material, energy, and/or information flow, thus creating a list of elements that may be affected by an operator action. The list of elements, with the links known from the topology, define a subset of the topology graph, the subgraph, and will be searched for cycles. The list of possibly affected elements and the detected cycles are presented to the operator. This may facilitate to identify a possible or real cycle with self-enforcing effects in the production process, e.g. in a recycle loop. This cycle or cycles may be occur as reactions to an operator action.

In various embodiments, the relation between the plurality of elements comprises a material flow, an energy flow, and/or an information flow. This reflects or deals with the fact that industrial plants are networks, in some cases complex networks, of elements connected by a flow of material, energy and information. So, the relations relate to different kinds connections, which make the elements interdependent and make a change at one element to cause an impact on one or more other elements.

In various embodiments, the directed edges are attributed edges. The attributed edges may be related to a quantitative impact on another element. This may facilitate to have a quantitative evaluation of the effect(s) of an operator action and/or a change of a process variable. In cases, where the quantitative effect of a flow is not available directly from the PFD, the PFD may be combined, e.g., with measurement data and state estimations of the flow in a predefined situation. Also, historical or simulated data may be used for this and/or to derive cause-and-effects. This may also be a base to "linguistically" quantify the (side) effects of an operator action.

In some embodiments, at least one edge of the subset of attributed edges has a fuzzy attribute. Examples of a fuzzy attribute are Fuzzy Variables and/or Fuzzy Logic Rules. The fuzzy attribute may comprise a rule describing the effects between elements. For instance, a rule may describe:

IF the level of reactor A is above 50% THEN the flow in pipe B starts.
IF there is a flow in pipe B THEN the level of storage tank C raises.

These rules may be attributed human experts or may be derived from historical data.

In some embodiments, the starting node is a node with only outgoing edges. This is a node, into which no edge is directed. In other words, the starting node is a "source only node". This may relate to a "real input", i.e. a change that does not depend on another element of the process or the plant.

In some embodiments, the process flow diagram is a piping and instrumentation diagram, P&ID diagram. This advantageously provides a common format for describing the process or the plant.

An aspect relates to a computer program product comprising instructions, which, when the program is executed by a computer, cause the computer to carry out the method as described above and/or below.

An aspect relates to a computer-readable storage medium where a computer program or a computer program product as described above is stored on.

An aspect relates to a use of a method as described above and/or below for searching for a cyclic interdependency in a process flow diagram, PFD, of a processing system.

An aspect relates to an industrial plant or a processing system, comprising a computer on which instructions are stored, which, when the program is executed by the computer, cause the computer and/or the industrial plant to carry out the method as described above and/or below.

For further clarification, embodiments of the invention are described by means of embodiments shown in the figures. These embodiments are to be considered as examples only, but not as limiting.

FIG. 1 schematically shows an example 100 of analysing effects of an operator action according to an embodiment. An operator action 110 may trigger the graph analyser 120 to evaluate a directed graph 140. The directed graph 140 may use a process flow diagram (PFD)—examples of shown elements comprise a tank and a level measurement—and transform the PFD into the directed graph 140, which may, in an embodiment, depict these elements. Starting from a starting node in the directed graph 140, the directed graph 140 is traversed. By traversing from the starting node to its neighbours and its neighbour's neighbours (and so on), a subgraph 150 is created. This subgraph 150 contains all elements that are affected by the operator action. In a simple realization of the method, the subgraph may be presented to the operator. Additionally or as an alternative, the subgraph may be searched for cycles, i.e. paths within this graph that return to a preceding element or the first element in the path, in cycle analyser 160. The cycle analyser 160 may, for instance, use Johnson's algorithm to find the shortest paths between all pairs of vertices in the directed graph. Additionally or as an alternative, a list of all elements and all relations of the subgraph is output, e.g. in a display 180.

Figure 2:
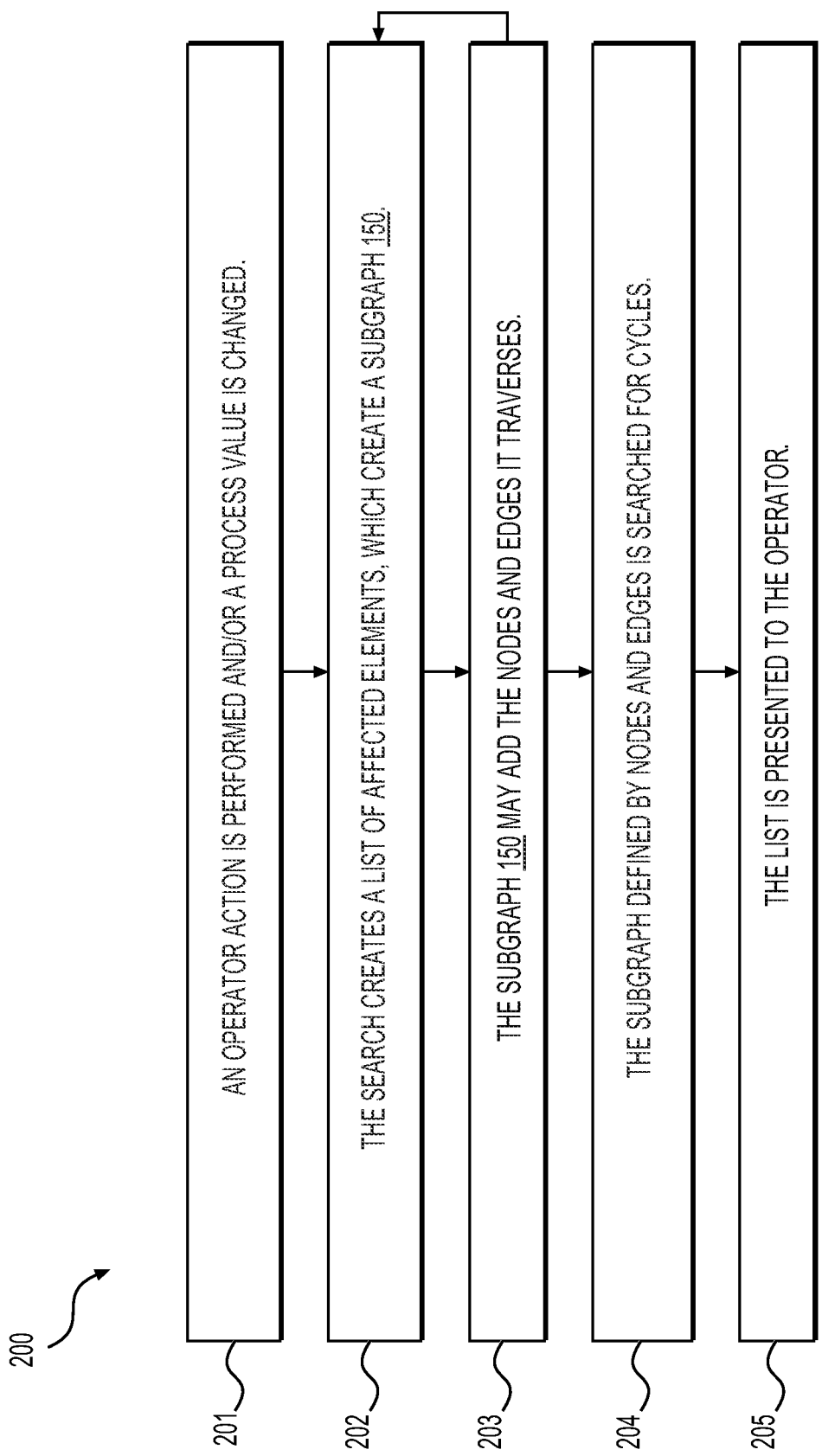
FIG. 2 schematically shows a flow chart of identifying affected elements and of finding cycles according to an embodiment.

FIG. 2 schematically shows a flow chart 200 of identifying affected elements and of finding cycles according to an embodiment. In a step 201, an operator action is performed and/or a process value is changed. The process value may be selected by may be the operator for investigating effects. The operator action and/or the process value linked to an element. In the directed graph 140 (see FIG. 1), this element is used as starting point for a breadth-first search, or alternatively for a depth-first search, which may not explore all the paths, like Dijkstra's shortest-path algorithm. In a step 202, the search creates a list of affected elements, which create a subgraph 150. The subgraph 150 also comprises edges defined by energy, material and information flow. In a step 203, the subgraph 150 may add the nodes and edges it traverses. In a step 204, the subgraph defined by nodes and edges is searched for cycles, which might introduce unexpected self-enforcing responses to the operator action or untypical process value. In a step 205, the list is presented to the operator.

Figure 3:
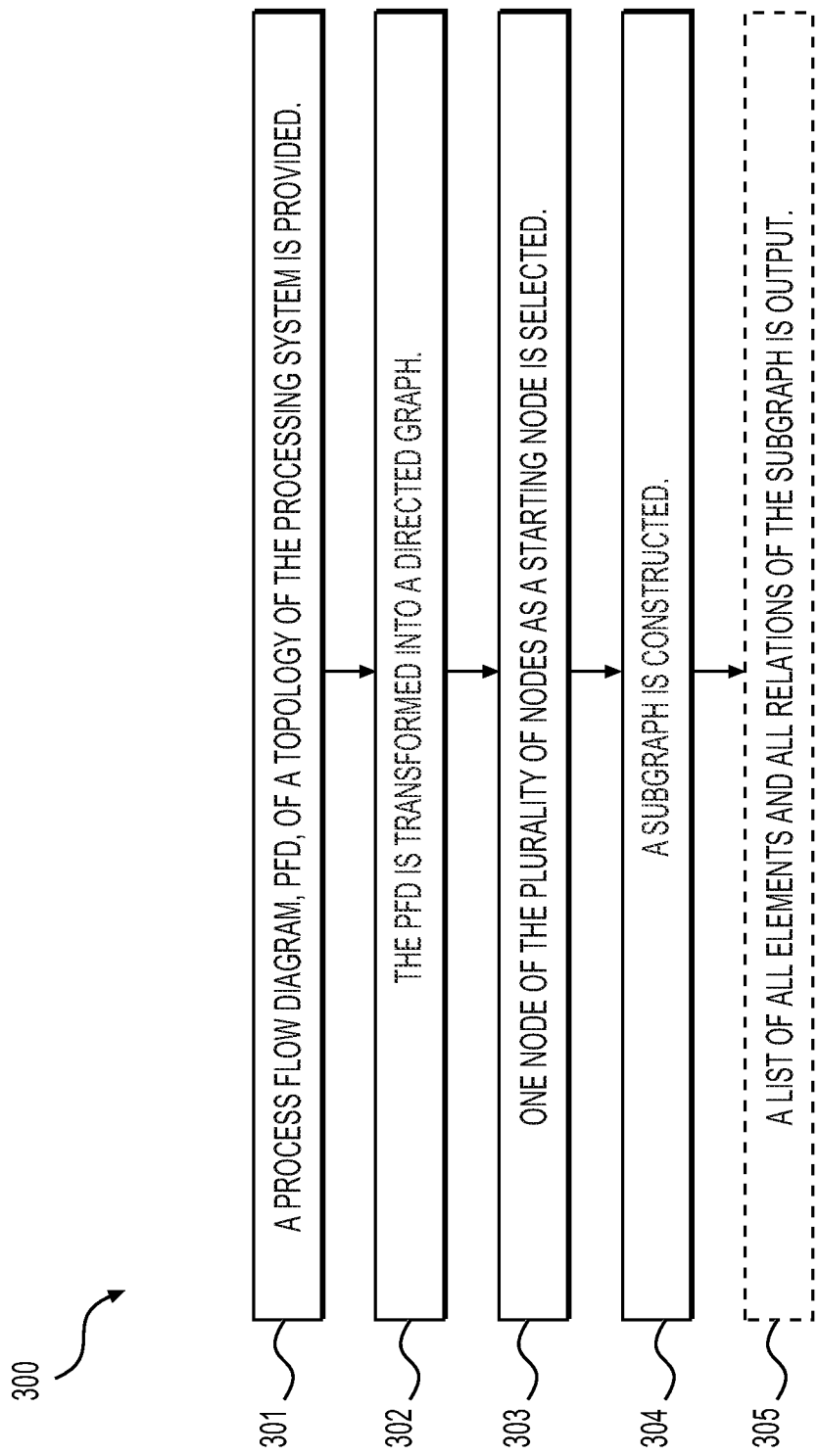
FIG. 3 schematically shows a flow chart of a method according to an embodiment.

FIG. 3 schematically shows a flow chart 300 of a method according to an embodiment for determining an interdependency between a plurality of elements in a processing system. In a step 301, a process flow diagram, PFD, of a topology of the processing system is provided. In a step 302, the PFD is transformed into a directed graph, wherein each element of the plurality of elements is transformed into a node and each relation between the plurality of elements is transformed into a directed edge. In a step 303, one node of the plurality of nodes as a starting node is selected. In a step 304, a subgraph is constructed, wherein the subgraph consists of all the nodes that are forward-connected from the starting node, thus showing at least one interdependency between the plurality of elements in the subgraph. In an optional step 305, a list of all elements and all relations of the subgraph is output.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A computer-implemented method for determining an interdependency between a plurality of elements in an industrial processing system, the elements comprising actuators and sensors of the industrial processing system, the method comprising:

providing a process flow diagram (PFD) of a topology of the processing system, the PFD being a piping and instrumentation (P&ID) diagram;

transforming the PFD into a directed graph, each element of the plurality of elements being transformed into a node and each relation between the plurality of elements being transformed into a directed edge, the relation between the plurality of elements representing a material flow and/or an energy flow;

selecting one node of the plurality of nodes as a starting node;

constructing a subgraph, the subgraph comprising all the nodes that are forward-connected from the starting node so as to show at least one interdependency between the plurality of elements in the subgraph;

for the subgraph, outputting all nodes and all relations of the subgraph;

searching, in the subgraph, for a cyclic interdependency; and outputting affected elements and detected cycles as a visualization of a cause and effect relationship inside the industrial processing system.

2. The method of claim 1, wherein the directed edges comprise attributed edges.

3. The method of claim 2, wherein at least one edge of a subset of attributed edges has a fuzzy attribute.

4. The method of claim 1, wherein the starting node comprises a node with only outgoing edges.

5. The method of claim 1, wherein the visualization comprises a dynamically created process graphic or a cause-and-effect matrix.

6. One or more non-transitory computer-readable mediums having processor-executable instructions stored thereon, wherein the processor-executable instructions, when executed, facilitate the method according to claim 1.

7. An industrial plant or a processing system, comprising:
   a computer, on which instructions are stored and which, when the instructions are executed by the computer, cause the computer, the industrial plant, and/or the processing system to carry out the method according to claim 1.

* * * * *